United States Patent [19]

Robinson

[11] 3,781,613

[45] Dec. 25, 1973

[54] RF TRANSISTOR CARRIER

[75] Inventor: Eugene A. Robinson, Dallas, Tex.

[73] Assignee: Collins Radio Company, Dallas, Tex.

[22] Filed: Oct. 10, 1972

[21] Appl. No.: 296,387

[52] U.S. Cl. .......................... 317/234 R, 317/234 G
[51] Int. Cl. .............................................. H01l 5/00
[58] Field of Search ..................................... 317/234

[56] References Cited

UNITED STATES PATENTS 3,404,214 10/1968 Elliott .................................. 174/52
3,471,753 10/1969 Burks et al. .......................... 317/234
3,479,570 11/1969 Gilbert ............................... 317/234

*Primary Examiner*—John S. Heyman
*Assistant Examiner*—E. Wojciechowicz
*Attorney*—Henry K. Woodward et al.

[57] ABSTRACT

An RF bipolar transistor and carrier which reduces inductance of the common lead of the transistor thereby increasing operational bandwidth and transistor gain especially in VHF-UHF applications. The carrier includes bonding pads for receiving the transistor and a low ohmage resistor and whereby wire bonds connected to the emitter and base regions of the transistor may be interlaced.

5 Claims, 4 Drawing Figures

RF TRANSISTOR CARRIER

This invention relates generally to transistor mounting devices, and more particularly to a carrier for RF transistors.

Inductances associated with lead interconnections of RF transistors operating in the UHF range can have a very detrimental effect on circuit behavior. For example, in operating a transistor in this frequency range with either a common emitter or common base mode, the inductance associated with the common lead can greatly increase the transistor input Q and thus reduce the operational bandwidth of the transistor circuit. Moreover, this inductance may also severely limit the transistor gain in amplifier operations. Further, the use of a low ohmage resistor in series with the common emitter is desirable to insure emitter-base forward bias in linear UHF applications.

In accordance with the present invention, a UHF transistor carrier is provided which minimizes the inductance associated with the common terminal of the transistor. The carrier allows interlacing of wire bonds for the emitter and base contacts and permits mounting of a low ohmage resistor for serial connection with the common terminal. In a preferred embodiment, the carrier includes a ceramic substrate with conductive metalization on first and second portions of one major surface and conductive metalization on the opposite major surface with the metalization of the first portion being integrally contiguous with the metalization on the opposite major surface. Two ceramic posts are mounted on the second portion at spaced ends of the portion with each post having metalization contiguous with the metalization on said second portion. A long rail member is mounted on the first portion with conductive metalization on the rail surface opposite from and electrically isolated from said first portion metalization.

In mounting a transistor on said carrier, the collector region is positioned on the second portion and a low ohmage resistor may be mounted on the first portion. Assuming a common emitter circuit configuration, a first plurality of wire bonds interconnect the emitter region with said resistor and a second plurality of wire bonds interconnect the base region with said rail. Preferably, the first and second pluralities of wire bonds are interlaced to minimize inductance of the common terminal leads.

The invention and objects and features thereof will be more fully understood from the following detailed description and appended claims when taken with the drawing, in which:

Figure 1:
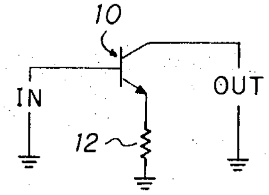
FIG. 1 is a schematic of a common emitter transistor as may be interconnected in accordance with the present invention.

Referring now to the drawings, FIG. 1 is a schematic of a common emitter transistor 10 including a low ohmage resistor 12 interconnected with the common emitter electrode. In linear UHF transistor applications, the emitter resistor 12 is provided to insure base-emitter junction forward bias. As described above, the common lead in UHF transistor applications (the emitter lead in the circuit of FIG. 1) may have sufficient inductance to detrimentally affect the operational behavior of the transistor circuit. Such inductances typically increases the transistor input Q (limits transistor bandwidth) and reduces the gain of the transistor in amplifier operation.

Figure 2:
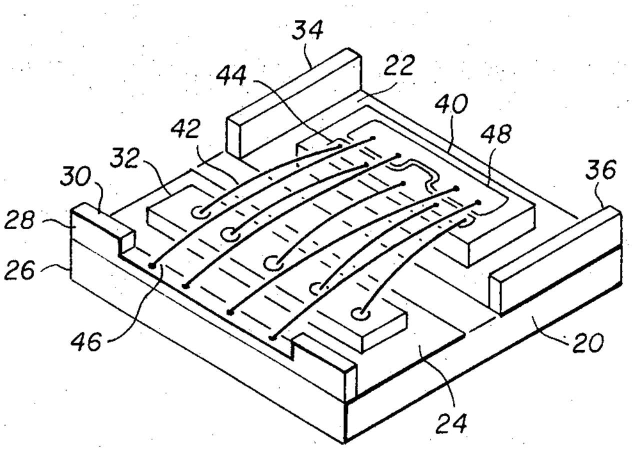
FIG. 2 is a perspective view of a UHF transistor and carrier therefor in accordance with the present invention.

FIG. 2 is a perspective view of a UHF transistor mounted on a carrier in accordance with the present invention wherein the common lead inductance is minimized. The transistor carrier comprises a ceramic substrate 20, beryllia or alumina for example, having conductive metalization on portions 22 and 24 on one major face thereof. The metalization may comprise deposited gold or aluminum, for example. Conductive metalization is also provided on end surface 26 and on the bottom surface with the metalization 24 and the metalization on the bottom major surface being integrally contiguous through the metalization on end portion 26. Rail member 28 having conductive metalization on the upper surfaces 30 is adhesively mounted near one end of conductive portion 24, and a low ohmage resistor 32 is conductively mounted on the remaining exposed area of conductive portion 24. Two ceramic post members 34 and 36, each having conductive metalization on all exposed surfaces, are mounted in spaced alignment on and in conductive union with the first conductive portion 22. Mounted therebetween is the RF transistor 40 with the collector region thereof conductively engaging portion 22. A first plurality of wire bonds 42 electrically interconnect the emitter 44 of transistor 40 to resistor 32. A second plurality of wire bonds 46 electrically interconnect the base 48 of transistor 40 with the conductive surface 30 of rail member 28. It will be noted that the plurality of wire bonds 42 and the plurality of wire bonds 46 are interlaced. Such interlacing of the emitter and base wire bonds has proved to reduce the inductance of the common terminal (e.g., emitter) lead, thereby permitting improved transistor operation particularly in UHF applications.

Figure 3:
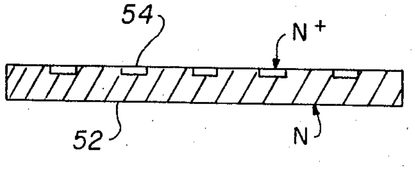
FIG. 3 is a section view of a resistor useful in UHF transistor applications.

As described above, resistor 32 is preferably a low ohmage, high current capacity resistor which insures the forward bias of the base-emitter junction. FIG. 3 is a section view of one such resistor which accommodates the wire bond interlacing and effects a uniform current distribution through the resistor. The resistor comprises a semiconductor wafer 52 of N-type dopant conductivity. Diffused into the upper surface of wafer 52 are a plurality of highly doped regions 54 which accommodate the wire bond connections, thereby distributing current flow across wafer 52. Typically, the resistance between any one highly doped region 54 and the bottom surface of wafer 52 is approximately 1 ohm, and with 5 such regions provided across wafer 52 the effective resistance of the parallel connections is 0.2 ohm. Thus, a low ohmage, high current resistor is provided which accommodates a plurality of wire bonds thereto.

Figure 4:
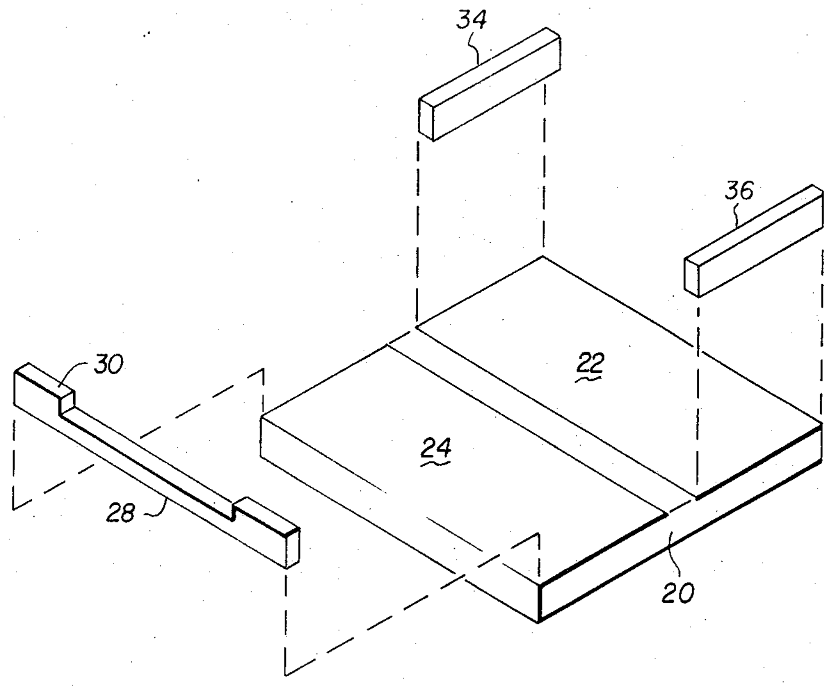
FIG. 4 is an exploded perspective view of a transistor carrier in accordance with the present invention.

FIG. 4 is an exploded perspective view of the carrier of FIG. 2 which further illustrates the construction of this embodiment of the invention. As described above, the carrier comprises a major ceramic substrate 20 having metalization on first and second portions 22 and 24 of a major surface. Conductive metalization is also provided on the bottom surface of wafer 20 which is integrally contiguous with the metalization of portion 24.

Ceramic rail 28 has metalization only on the upper surface 30 and is mounted on portion 24 by means of suitable adhesive epoxy. Ceramic posts 34 and 36 each having conductive metalization of all exposed surfaces are electrically conductively bonded by soldering or the like in spaced alignment on conductive portion 22.

The transistor carrier in accordance with the present invention has proved very successful in increasing the operational performance of transistors in the UHF frequency range. Further, the carrier may be tuned upside down from electrical testing without damage to the wire bonds. While the invention has been described with reference to a specific embodiment, the description is illustrative and not to be construed as limiting the invention. Various modifications and changes may occur to those skilled in the art without departing from the spirit and scope of the invention as defined by the appended claims.

What is claimed is:

1. A carrier for an RF transistor and a resistor comprising a substrate having opposed major surfaces, conductive metalization on first and second portions of said first major surface, conductive metalization on said second major surface integrally contiguous with said conductive metalization on said first portion, a rail member insulatively mounted on one end of said first portion whereby a resistor member may be mounted on said first portion in juxtaposition with said rail member, said rail member having conductive metalization on a surface spaced from said first portion, and a pair of post members having conductive metalization on surfaces thereof, said post members mounted on said second portion in spaced alignment whereby a transistor may be mounted therebetween on said second portion with said conductive metalization of said second portion in conductive union with said conductive metalization of said post members, said carrier allowing interlacing of wire bonds from said transistor to said rail member and said resistor.

2. A carrier as defined by claim 1 wherein said substrate is ceramic.

3. A carrier as defined in claim 1 wherein said surface of said rail member having conductive metalization includes two raised end portions with a central recessed portion.

4. An RF bipolar transistor and carrier comprising a semiconductor wafer having a collector region contiguous with one major surface and base and emitter regions contiguous with an opposite major surface; a carrier including a substrate having opposed major surfaces, conductive metalization on first and second portions of said first major surface, conductive metalization on said second major surface integrally contiguous with such conductive metalization on said first portion, a rail member insulatively mounted on one end of said first portion, said rail member having conductive metalization on a surface spaced from said first portion, and a pair of post members having conductive metalization on surfaces thereof, said post members mounted on said second portion in spaced alignment with said conductive metalization of said second portion in conductive union with said conductive metalization of said post members; a low ohmage, high current capacity resistor; said transistor being mounted to said second portion of said substrate between said pair of post members with said collector in conductive union with said conductive metalization of said second portion; said resistor being mounted on said first portion of said substrate in juxtaposition with said rail member and in conductive union with said conductive metalization of said first portion; first interconnect means connecting said conductive metalization of said rail member to one of said base and emitter regions of said transistor; and second interconnect means connecting said resistor to the other of said base and emitter regions on said transistor.

5. An RF bipolar transistor and carrier as defined by claim 4 wherein said first and second interconnect means comprise first and second pluralities of interlaced wire bonds.

* * * * *